US006529859B1

(12) United States Patent
Demir et al.

(10) Patent No.: US 6,529,859 B1
(45) Date of Patent: Mar. 4, 2003

(54) OSCILLATOR PHASE NOISE PREDICTION

(75) Inventors: Alper Demir, Jersey City, NJ (US); Jaijeet Shankar Roychowdhury, Jersey City, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/411,015

(22) Filed: Oct. 1, 1999

(51) Int. Cl.[7] .............................................. G01R 29/26
(52) U.S. Cl. ...................... 702/191; 702/196; 702/69; 702/72; 324/613
(58) Field of Search .................. 702/57, 66, 69, 702/72–73, 106–107, 117, 124, 126, 183, 189, 191, 195–196, FOR 103, FOR 104, FOR 110, FOR 134, FOR 135, FOR 166, FOR 170–FOR 171, 70, 71, 74, 111, 193; 703/2, 4; 331/77; 324/613, 614, 622, 623

(56) References Cited

U.S. PATENT DOCUMENTS 4,725,852 A * 2/1988 Gamblin et al. ............... 347/75
5,059,927 A * 10/1991 Cohen ........................... 331/77
5,341,110 A * 8/1994 Nardi ............................ 331/17
6,157,180 A * 12/2000 Kuo ............................ 323/282
6,167,359 A * 12/2000 Demir et al. ................ 702/191
6,232,844 B1 * 5/2001 Talaga, Jr. ..................... 331/57

FOREIGN PATENT DOCUMENTS

EP      1 096 661 A2 * 5/2001

* cited by examiner

Primary Examiner—Hal Wachsman
(74) Attorney, Agent, or Firm—John Ligon

(57) ABSTRACT

The phase noise of an oscillator described by a known set of differential algebraic equations (DAEs) can be predicted by a) finding the steady state waveform of the oscillator, e.g., by using harmonic balance techniques or so-called "shooting" techniques, either of which involves developing a mathematical quantity known as the augmented Jacobian matrix; b) solving a prescribed linear system of equations that uses the augmented Jacobian matrix, the solution being called a perturbation projection vector (PPV), c) plotting a graph of the phase noise of the oscillator as a Lorentzian function of the solution of the prescribed linear system of equations. The prescribed linear system of equations which is used is the system of equations formed by setting a matrix product equal to a unit vector.

14 Claims, 1 Drawing Sheet

OSCILLATOR PHASE NOISE PREDICTION

TECHNICAL FIELD

This invention relates to the art of oscillators, and more particularly, to predicting the phase noise of oscillators for use in designing and building oscillators that meet prescribed conditions.

BACKGROUND OF THE INVENTION

Oscillators are used in many circuits. In particular, with regard to oscillators for use in wireless, e.g., radio, communications, the accuracy of the frequency of the oscillator employed is very important in determining the channel selectivity, i.e., the ability to discriminate between different adjacent channels. Phase noise, also known as timing jitter, is the main factor that determines the frequency accuracy. Thus, it is necessary that the oscillator employed have no more than a prescribed amount of phase noise.

It is known that it is desirable to simulate an oscillator to determine its phase noise prior to actually building the oscillator, in order to be sure that the oscillator does not exceed the prescribed amount of phase noise. However, prior art techniques for determining the phase noise of an oscillator either are very slow or are inaccurate predictors of the actual phase noise experienced when the oscillator is actually built.

SUMMARY OF THE INVENTION

We have recognized that the phase noise of an oscillator described by a known set of differential algebraic equations (DAEs) can be quickly and accurately predicted, in accordance with the principles of the invention, by a) finding the steady state waveform of the oscillator, e.g., by using harmonic balance techniques or so-called "shooting" techniques, either of which involves developing a mathematical quantity known as the augmented Jacobian matrix; b) solving a prescribed linear system of equations that uses the augmented Jacobian matrix, the solution being called a perturbation projection vector (PPV), c) plotting a graph of the phase noise of the oscillator as a Lorentzian function of the solution of the prescribed linear system of equations.

More specifically, in accordance with an aspect of the invention, the prescribed linear system of equations which is used is the system of equations formed by setting a matrix product equal to a unit vector. The factors in the matrix product are 1) a form of the augmented Jacobian matrix, e.g., the Hermitian, for use with the harmonic balance technique, or the adjoint, for use with shooting, and 2) the PPV. The variables of the Lorentzian function of the solution of the prescribed linear system of equations includes 1) the frequency at which the phase noise is to be found, 2) a jitter factor determined for the oscillator, and 3) the steady state waveform of the oscillator, which includes the natural frequency of the oscillator. The jitter factor for the oscillator is determined in accordance with the method disclosed in our co-pending and commonly assigned U.S. patent application Ser. No. 09/096856, now issued as U.S. Pat. No. 6,167,359, which is incorporated by reference as if fully set forth herein, but using therein the PPV as described hereinabove. Note that a) that which is referred to herein as the PPV is referred to in U.S. patent application Ser. No.09/096856 as $v_1(t)$, and that which referred to herein as the jitter factor is referred to in U.S. patent application Ser. No. 09/096856 as c, all the other variables being as described in U.S. patent application Ser. No. 09/096856.

Detailed Description

Figure 1:
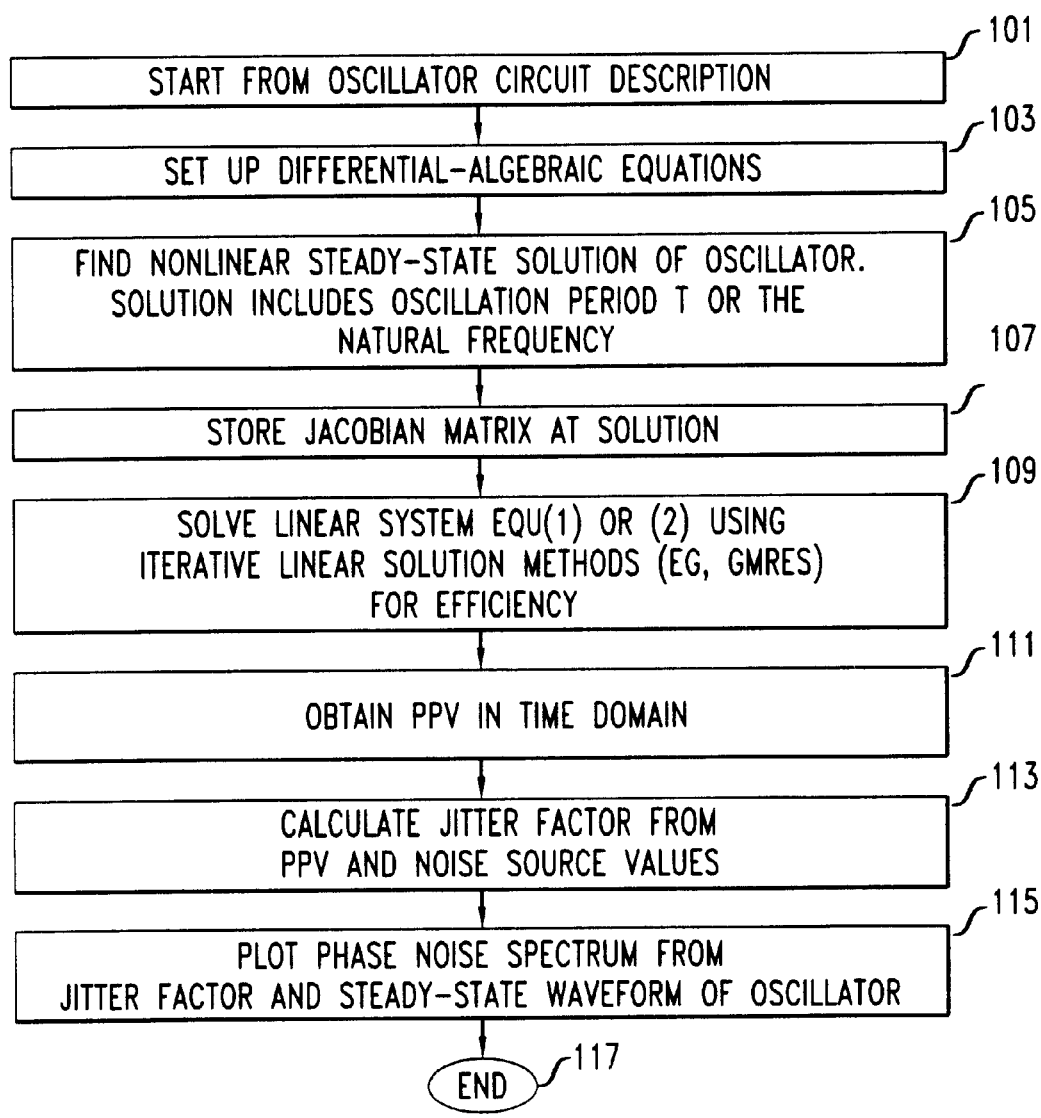
FIG. 1 shows an exemplary process for developing a plot of the phase noise of an oscillator.

In the disclosure of the invention following, all statements reciting principles, aspects, and embodiments of the invention, as well as specific examples thereof, are intended to encompass both structural and: functional equivalents thereof. Additionally it is intended that such equivalents include both currently known equivalents as well as equivalents developed in the future, i.e., any elements developed that perform the same function, regardless of structure.

Thus, for example, it will be appreciated by those skilled in the art that the block diagrams herein represent conceptual views of illustrative circuitry embodying the principles of the invention. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown.

The functions of the various elements shown in the figure, including functional blocks labeled as "processors" may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementor as more specifically understood from the context.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein.

FIG. 1 shows an exemplary process for developing a plot of the phase noise of an oscillator. Such oscillators are often described in a language of a particular circuit simulator, e.g., the well known SPICE circuit simulator. The process is entered in step 101 when the language description of the oscillator is supplied. Next, in step 103, a set of differential algebraic equations (DAEs) are derived from the description of the oscillator. For further information on this derivation see, for example, L. O. Chua and P-M. Lin, Computer-aided Analysis of Electronic Circuits: Algorithms and Computational Techniques, Prentice-Hall, 1975. Furthermore, in SPICE, for example, this is an internal operation of the SPICE simulator. Those of ordinary skill in the art of SPICE development will readily be able to obtain the DAEs from the internals of SPICE, which are readily accessible as the source code for SPICE is freely available. See for example SPICE2: A computer Program to Simulate Semiconductor Circuits, which is a Ph.D. thesis available as Memorandum No. Electronics Research Laboratory, (ERL)-M520, Electrical Engineering and Computer Sciences department, University of California, at Berkeley, by Laurence Nagel or Analasys of Performance and Convergence Issues for Circuit Simulation, which is a Ph.D. thesis available as Memorandum No. Electronics Research Laboratory, (ERL)-M89/42, Electrical Engineering and Computer Sciences department, University of California, at Berkeley, by Thomas L. Quarles.

In step 105, the steady state waveform of the oscillator is found, e.g., by using harmonic balance techniques or so-called "shooting" techniques. These techniques are are described in K. S. Kundert et al., Steady-State Methods for Simulating Analog and Microwave Circuits, Academic Publishers (1990). Upon finding the steady state waveform of the oscillator, there will have been developed both by the harmonic balance techniques and so-called "shooting" techniques, an augmented Jacobian matrix. Thereafter, in accordance with an aspect of the invention, a prescribed linear system of equations that uses the augmented Jacobian matrix which was developed as part of finding the steady state waveform, the solution being called a perturbation projection vector (PPV), is solved in step 109. The prescribed linear system of equations which is used is the system of equations formed by setting the product of a form of the augmented Jacobian matrix, e.g., the Hermitian for use with the harmonic balance technique or the adjoint for use with shooting, with the PPV equal to a unit vector. If harmonic balance techniques were used to find the steady state waveform of the oscillator, then the following represents the resulting system of equations, where HB stand for harmonic balance, Aug signifies augmentation, *signifies Hermitian, and J signifies Jacobian matrix:

$$J^{HB}_{Avg}{}^{*}PPV^{HB} = \begin{bmatrix} 0 \\ 0 \\ \vdots \\ 0 \\ 1 \end{bmatrix}. \quad \text{eq. (1)}$$

Similarly, if shooting techniques were used to find the steady state waveform of the oscillator, then the following represents the resulting system of equations, where TD stands for time domain, adj stands for adjoint and N is the number of time points used in the shooting technique.

$$J^{TD}_{Avg}{}^{adj}PPV^{TD} = \begin{bmatrix} 0 \\ 0 \\ \vdots \\ 0 \\ N \end{bmatrix}. \quad \text{eq. (2)}$$

While there are many prior art methods that may be applied to solve equations 1 and 2, it may be particularly useful to employ the methods that employ so-called "iterative linear" technique described in Y. Saad, Iterative Methods for Sparse Linear Systems, PWS, 1996. Particularly efficient versions of the "iterative linear" technique that are useful in conjunction with the invention are P. Feldmann, R. C. Melville and D. Long, Efficient Frequency Domain Analysis of Large Nonlinear Analog Circuits, Proceedings of IEEE Custom Integrated Circuits Conference (CICC), May 1996. Modern harmonic balance solvers, as well as modern shooting solvers, typically already incorporate such iterative linear processes for finding the steady state waveform. It is simply required to provide the proper inputs to solve equations 1 or 2.

In optional step 111, which is only used if the initial steady state waveform was found using a harmonic balance solver, it is necessary to convert the PPV into the time domain, as the PPV solution to equation I is in the frequency domain, i.e., it is a representation of the PPV in terms of Fourier coefficients. If the initial steady state waveform was found using a shooting solver, step 111 is not necessary, since the PPV solution to equation 2 is in the time domain.

Next, in step 113, the jitter factor is calculated from the PPV in the time domain format. The jitter factor is determined in accordance with the method disclosed in our co-pending and commonly assigned U.S. patent application Ser. No. 09/096856, now issued as U.S. Pat. No. 6,167,359, which, as stated above, is incorporated by reference as if fully set forth herein, as but using therein the PPV as described hereinabove. Note that in U.S. patent application Ser. No. 09/096856, PPV is referred to as $v_s(t)$, the jitter factor is c, and all the other variables are as described therein. See in particular equation 8. It may also be useful to the oscillator designer to see the particular sources of the phase noise, such information which may be gleaned from equations 18-20.

A graph of the phase noise of the oscillator is plotted as a Lorentzian function of the solution of the prescribed linear system of equations, in step 115. The variables of the Lorentzian function of the solution of the prescribed linear system of equations includes 1) the frequency at which the phase noise is to be found, 2) jitter factor c, and 3) the steady state waveform of the oscillator, which includes the natural frequency of the oscillator, or alternatively, its inverse, the time period. Typically the graph is arranged by having the X-axis representing frequency and plotting the corresponding power spectrum of the oscillator along Y-axis. Often oscillator designers prefer that at least one, if not both, of the axes employ a logarithmic scale.

From the graph, the designers can tell immediately whether or not the oscillator design meets the specifications for the oscillator. Furthermore, the graph is useful because once the oscillator is actually built, a designer can use it as a validation of his design process if the actual measurements of the built oscillator's phase noise to substantially correspond to the graph. For example, if the measured phase noise is within a few dBm the oscillator design process may be considered valid. The best matches observed between actual measured oscillator phase noise and the phase noise graph developed as described above has been to within 0.2 dBm. However, it should be kept in mind that typical measuring equipment is only accurate to about 2 dBm.

The process then exits in step 117.

What is claimed is:

1. A method for plotting phase noise of an oscillator, comprising the steps of:

finding the steady state waveform of the oscillator, said finding step including developing an augmented Jacobian matrix;

developing a perturbation projection vector (PPV) by solving a linear system of equations, said linear system of equations being constituted as a function of said augmented Jacobian matrix and said PPV; and plotting a phase noise graph using the solution of said linear system of equations.

2. The method of claim 1 wherein said linear system of equations is the system of equations formed by setting a product of a form of said augmented Jacobian matrix and the PPV equal to a unit vector.

3. The method of claim 2 wherein said form of said augmented Jacobian matrix is a Hermitian matrix of said augmented Jacobian matrix when said steady state waveform of said oscillator is found in said finding step using harmonic balance techniques.

4. The method of claim 2 wherein said form of said augmented Jacobian matrix is an adjoint when said steady state waveform of said oscillator is found in said finding step using shooting.

5. The method of claim 1 wherein parameters of a Lorentzian function of the solution of the linear system of equations includes (i) a frequency at which the phase noise is to be found, (ii) a jitter factor determined for said oscillator, and (iii) the steady state waveform of the oscillator, which includes the natural frequency of the oscillator.

6. The method of claim 1 further including the step of comparing a plot of phase noise derived from measurements taken from an actually built physical world embodiment of said oscillator with said phase noise graph.

7. A computer-implemented software system for use in plotting phase noise of an oscillator, comprising:

a module for finding the steady state waveform of the oscillator, said finding module developing an augmented Jacobian matrix;

a module for developing a perturbation projection vector (PPV) by solving a linear system of equations, said linear system of equations being constituted as a function of said augmented Jacobian matrix and said PPV; and a module for plotting a phase noise graph using the solution of said linear system of equations.

8. The software system of claim 7 wherein said linear system of equations is the system of equations formed by setting a product of a form of said augmented Jacobian matrix and the PPV equal to a unit vector.

9. The software system of claim 7 wherein parameters of a Lorentzian function of the solution of the linear system of equations includes (i) a frequency at which the phase noise is to be found, (ii) a jitter factor determined for said oscillator, and (iii) the steady state waveform of the oscillator, which includes the natural frequency of the oscillator.

10. A method for plotting phase noise of an oscillator for which an augmented Jacobian matrix is known from a derivation of a steady state waveform of said oscillator, the method comprising the steps of:

developing a perturbation projection vector (PPV) by solving a system of equations formed by setting a product of a form of said augmented Jacobian matrix and the PPV equal to a unit vector; and plotting a phase noise graph using the solution of said linear system of equations.

11. The method of claim 10 further including the step of comparing a plot of phase noise derived from measurements taken from an actually built physical world embodiment of said oscillator with said phase noise graph.

12. The method of claim 10 wherein parameters of a Lorentzian function of the solution of the linear system of equations includes (i) a frequency at which the phase noise is to be found, (ii) a jitter factor determined for said oscillator, and (iii) the steady state waveform of the oscillator, which includes the natural frequency of the oscillator.

13. The method of claim 10 wherein said form of said augmented Jacobian matrix is a Hermitian matrix of said augmented Jacobian matrix when said steady state waveform of said oscillator is derived using harmonic balance techniques.

14. The method of claim 10 wherein said form of said augmented Jacobian matrix is an adjoint when said steady state waveform of said oscillator is derived using shooting.

* * * * *